US006617201B2

(12) United States Patent
Chye et al.

(10) Patent No.: US 6,617,201 B2
(45) Date of Patent: Sep. 9, 2003

(54) U-SHAPE TAPE FOR BOC FBGA PACKAGE TO IMPROVE MOLDABILITY

(75) Inventors: Lim T. Chye, Singapore (SG); Lee C. Kuan, Singapore (SG); Jeffrey Toh, Singapore (SG); Tim Teoh, Singapore (SG); Patrick Guay, Singapore (SG); Choong L. Wah, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/260,924

(22) Filed: Sep. 30, 2002

(65) Prior Publication Data

US 2003/0025185 A1 Feb. 6, 2003

Related U.S. Application Data

(62) Division of application No. 09/650,125, filed on Aug. 29, 2000, now Pat. No. 6,486,536.

(51) Int. Cl.[7] .............................................. H01L 21/44
(52) U.S. Cl. ........................ 438/125; 438/126; 438/127; 438/106
(58) Field of Search .......................... 438/125, 126–127, 438/106

(56) References Cited

U.S. PATENT DOCUMENTS

| 6,281,044 B1 | 8/2001 | VanNortwick ............... 438/111 |
| 6,473,311 B1 * | 10/2002 | James et al. ................. 361/777 |
| 2001/0038141 A1 | 11/2001 | Wensel ......................... 257/667 |
| 2002/0016023 A1 | 2/2002 | Bolken ......................... 438/112 |

FOREIGN PATENT DOCUMENTS

| JP | 6-232195 | 8/1994 |
| JP | 10-116814 | 12/1998 |
| JP | 10-447247 | 7/1999 |

* cited by examiner

*Primary Examiner*—David L. Talbott
*Assistant Examiner*—Luan Thai
(74) *Attorney, Agent, or Firm*—Fletcher, Yoder & Van Someren

(57) ABSTRACT

An FBGA packaged device including a die adhered to a substrate with a small gap being formed between the die and substrate. An opening is formed through the substrate adjacent the center portion of the die. An encapsulating mold is formed around the die extending into the gap and also filling the channel. At least one barrier is disposed in the gap between the substrate and the die adjacent the channel to control the flow path of the encapsulating material as the mold is formed in the package.

9 Claims, 4 Drawing Sheets

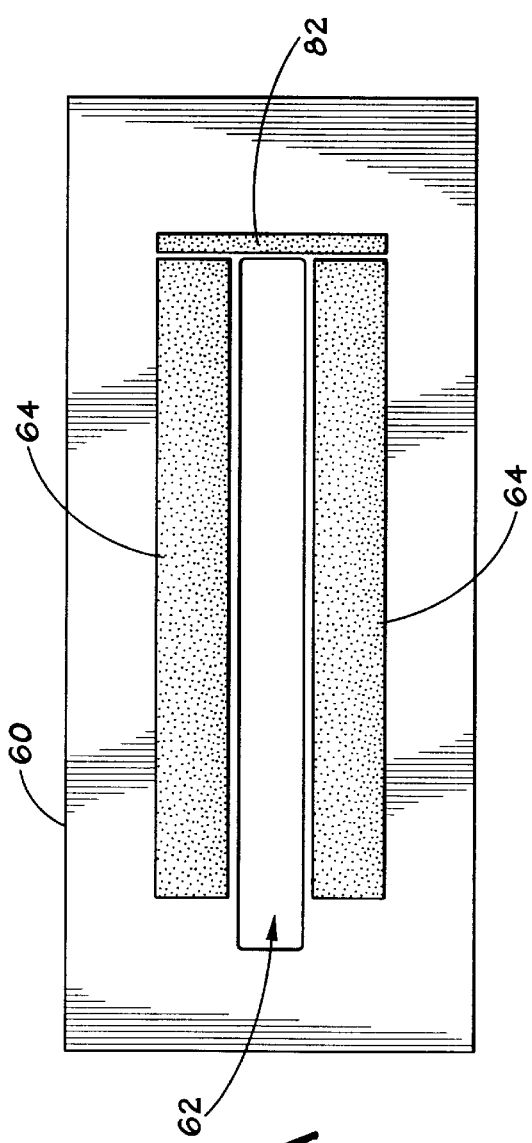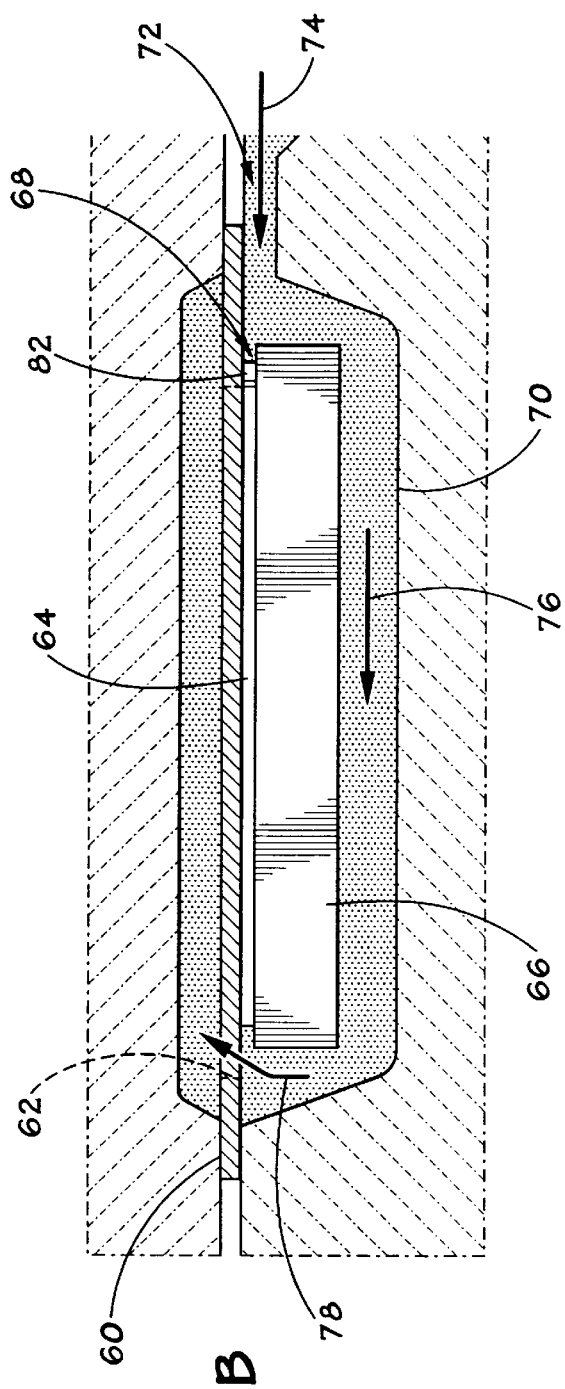

U-SHAPE TAPE FOR BOC FBGA PACKAGE TO IMPROVE MOLDABILITY

This application is a divisional of application Ser. No. 09/650,125, filed on Aug. 29, 2000, now U.S. Pat. No. 6,486,536.

BACKGROUND OF THE INVENTION

1. Field of the Invention

The present invention relates generally to semiconductor fabrication. More particularly, the present invention relates to the fabrication of BOC (Board-on-Chip) FBGA (fine-pitch ball grid array) packages.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled circuits are used in a wide variety of applications. Such applications include personal computers, control systems, telephone networks, and a host of consumer products. As is well known, microprocessors are essentially generic devices that perform specific functions under the control of a software program. This program is stored in a memory device coupled to the microprocessor. Devices such as these are formed from a plurality of electrical circuits placed together in what is known in the art as a package. The packaging of electrical circuits is a key element in the technological development of any device containing electrical components. Many electrical circuits are packaged for surface mounting, and Fine-Pitch Surface Mount Technology (FPT) and Pin Grid Array (PGA) technology are well developed areas of this type of packaging technology. In addition, an emerging packaging method has been developed using Ball Grid Array (BGA) technology.

BGA technology offers several advantages over FPT and PGA. Among the most often cited advantages of BGA are: reduced co-planarity problems, since there are no leads; reduced placement problems; reduced paste printing problems; reduced handling damage; smaller size; better electrical and thermal performance; better package yield; better board assembly yield; higher interconnect density; multi-layer interconnect options; higher I/Os for a given footprint; easier extension to multichip modules; and faster design-to-production cycle time.

While BGA technology provides many benefits, there is still a growing demand for more component functionality in a smaller space. Despite the benefits provided by BGA technology, BGA is still a surface mount technology like FPT and PGA and, thus, is limited by the space available on the mounting surface. Significant research and development has been devoted to finding ways to get more and more capabilities into smaller areas. Engineers have been challenged with finding ways to increase hardware capabilities, with memory capacity being one area in which board geography is at a particular premium is memory. However, regardless of whether FPT, PGA or BGA is implemented, surface mount technologies are limited by the space available on the ceramic substrate or printed circuit board (PCB). As a result, the amount of memory will disadvantageously be limited by the dimensions of the mounting surface.

An advance in BGA array technology has been found in the reduction of ball pitch used in forming the arrays. This technology, known as Fine-Pitch ball Grid Array (FBGA), allows for a smaller footprint and higher density of electrical connections than does conventional BGA technology. For example, in one instance a conventional BGA device measures 35 mm square and contains 352 balls or bumps in the array, this is compared to a similar device made using FBGA technology which measures 21 mm square and contains 400 balls in the array.

In forming BGA and FBGA packages, one important step is that of encapsulating the microchip or die and substrate. Proper flow of the encapsulating material is required to obtain maximum uniformity in the resultant characteristics of the molded encapsulating material. Non-uniform material characteristics in the molded encapsulating material can create undesired stresses resulting in cracking of the encapsulating body. Other harmful effects of improper molding techniques include delamination of the molded encapsulating material and bridging of electrical pathways. Thus the encapsulating process plays an important role in formation of BGA and FBGA packaged devices.

The present invention may address one or more of the problems set forth above.

SUMMARY OF THE INVENTION

Certain aspects commensurate in scope with the originally claim invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, an FBGA packaged device is provided. The package includes a die adhered to a substrate with a small gap being formed between the die and substrate. An opening, or a channel, is formed through the substrate adjacent the center portion of the die. An encapsulating mold is formed around the die, extending into the gap and also filling the channel. At least one barrier is disposed between the substrate and the die adjacent the channel to control the flow path of the encapsulating material, or molding compound, as the mold is formed in the package.

The present invention also provides a method for forming an encapsulated BGA or FBGA device allowing for improved moldability in the encapsulated package. The method provides for strategically placing a barrier between a die and a substrate to control the flow of molding compound thus producing more uniform material characteristics and fewer defects in the resultant mold.

DESCRIPTION OF THE DRAWINGS

The foregoing and other advantages of the invention will become apparent upon reading the following detailed description and upon reference to the drawings in which:

FIG. 5A illustrates a plan view of the substrate of a FBGA according to the present invention; and FIG. 5B illustrates an elevational view of a FBGA device according to the present invention in elevation view during the molding process.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
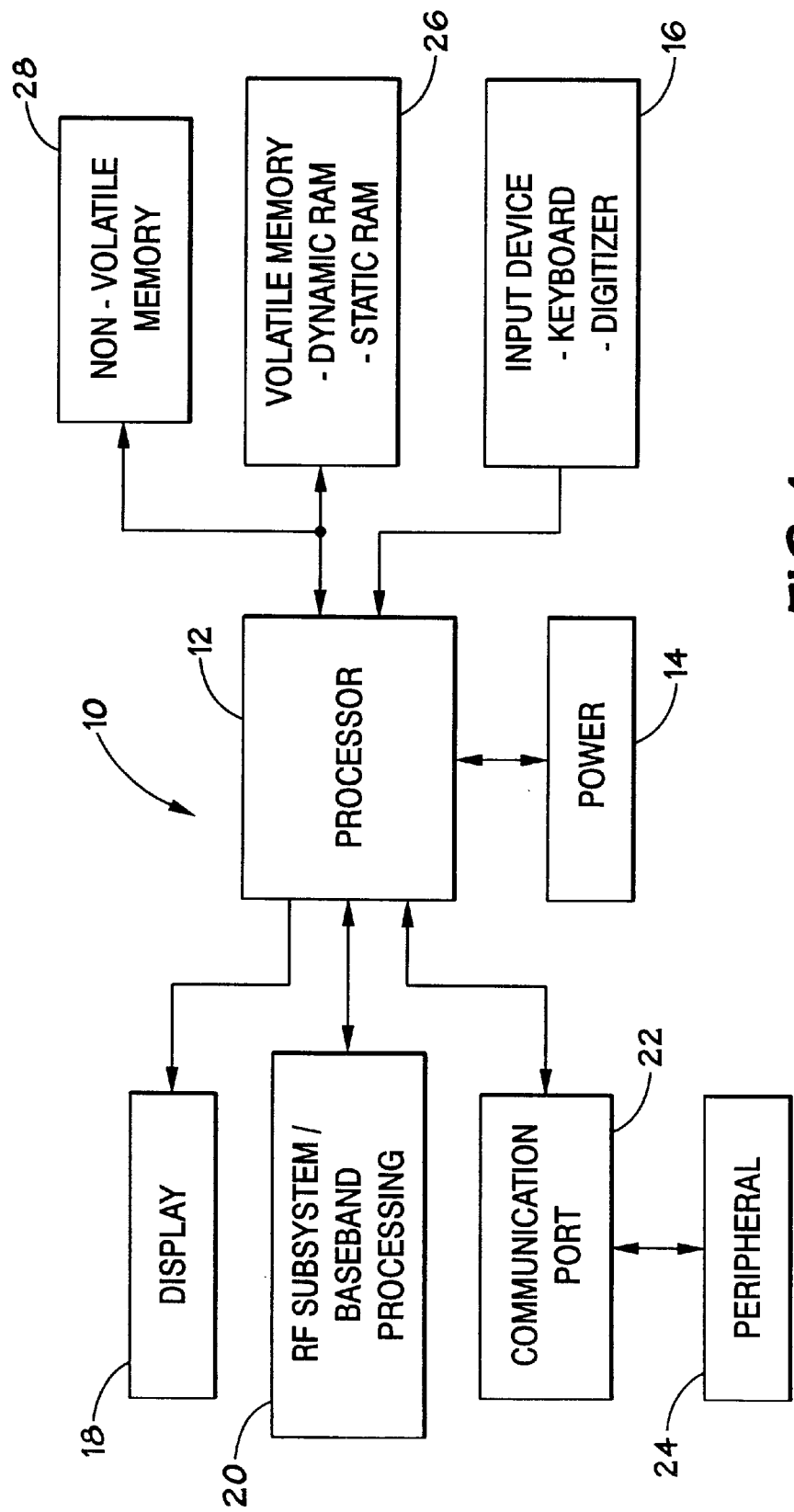
FIG. 1 illustrates a block diagram of an exemplary processor-based device in accordance with the present invention.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include buttons, switches, a keyboard, a light pin, a mouse, and/or a voice recognition system, for instance. A display 18 may also be coupled to the processor 12. The display 18 may include an LCD display, a CRT, LED's, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the program. For instance, the processor 12 may be coupled to volatile memory 26, which may include dynamic random access memory (DRAM) and/or static random access memory (SRAM). The processor 12 may also be coupled to non-volatile memory 28. The non-volatile memory 28 may include a read only memory (ROM), such as an EPROM or Flash-Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk or tape drive memory.

Figure 2:
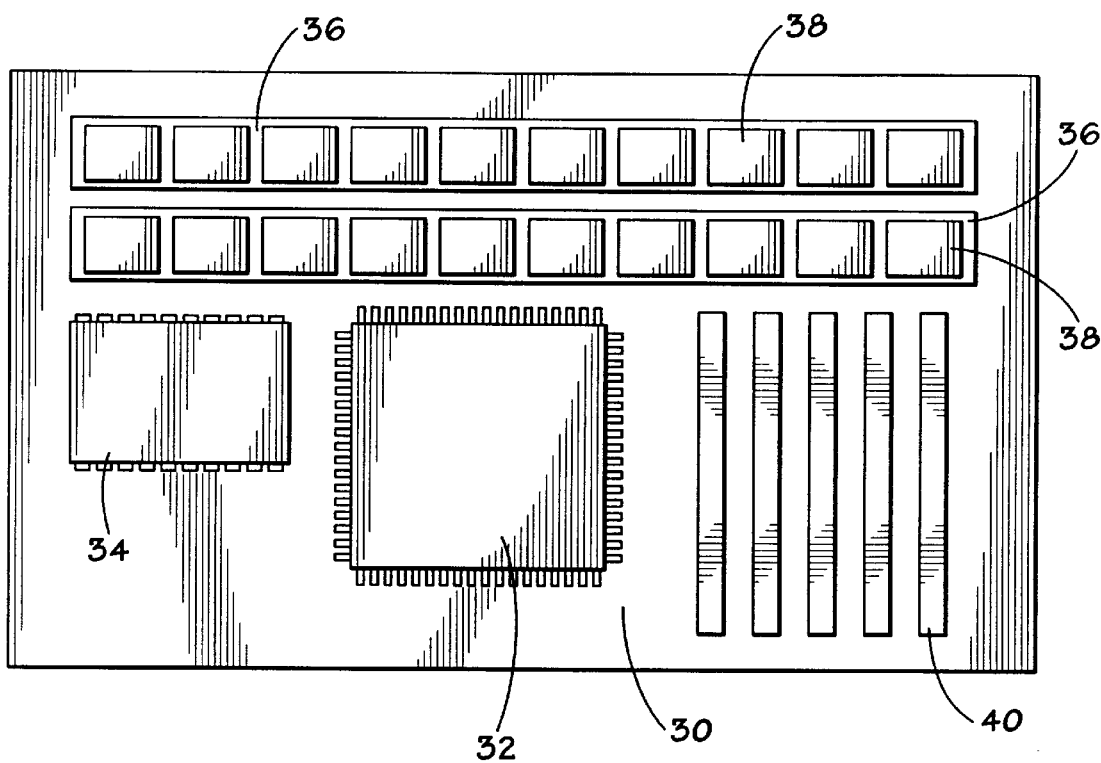
FIG. 2 illustrates a plan view of a circuit board having various devices employed thereon in plan view.

Referring to FIG. 2, a circuit board 30 is shown having various devices and connections coupled to its surface. A microprocessor 32 is shown along with a ROM device 34 and a set of memory modules 36, each containing a plurality of RAM chips 38. A plurality of connections or ports 40 are also located on the circuit board 30 allowing for connection to various peripheral devices and expansion modules. In a computer application, for example, such devices and expansion modules might include sound cards, video cards, additional memory modules or connections for input and output peripherals. While the present embodiment has a direct relation to memory chips such as the ROM device 34 and RAM chip 36, the techniques described below may be applied to any device package having similar mounting characteristics including, if desired, the microprocessor 32.

Figure 3:
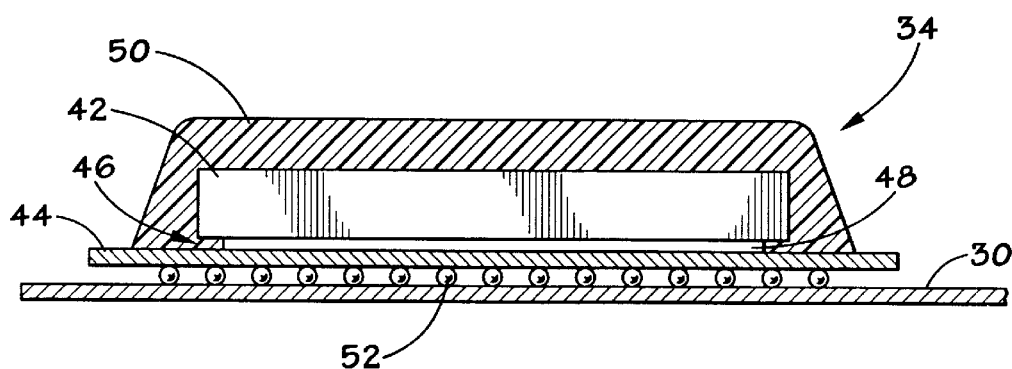
FIG. 3 illustrates an elevational view of a BGA device attached to a circuit board in elevation view.

Referring to FIG. 3, a typical BGA device 34 is depicted. The BGA device includes a chip or die 42 adhered to a substrate 44. The die is a semiconducting device typically having a plurality of transistors, capacitors, and/or electrical connections. A gap 46 is formed between the die 42 and the substrate 44. The gap 46 is typically a result of adhesive 48 which is disposed between the die 42 and the substrate 44. While the adhesive 48 may be employed in various forms, the specific embodiment shown in FIG. 3 utilizes tape.

A plurality of conductive balls 52 are arranged in an array on the surface of the substrate opposite the die 42. The conductive balls 52 are typically formed of solder. The conductive balls 52 are electrically connected to wire bonds (not shown) extending from the die. The device 34 is placed onto a circuit board 30 having a plurality of bond pads (not shown). The bond pads are utilized for electrically coupling the BGA 34 device to the circuit board 30. To facilitate connection of the BGA device 34 to the circuit board 30, the bond pads are arranged to mirror the array pattern of the conductive balls 52. The device 34 is attached to the circuit board 30 by reflowing the solder of the conductive balls 52 while they are in contact with the bond pads. This serves to create an electrical connection between the conductive balls 52 and the bond pads of the circuit board 30. It is noted that, while the discussion regarding FIG. 3 is illustrative of a BGA, the principles discussed are likewise applicable to PGA and FBGA devices.

Figure 4A:
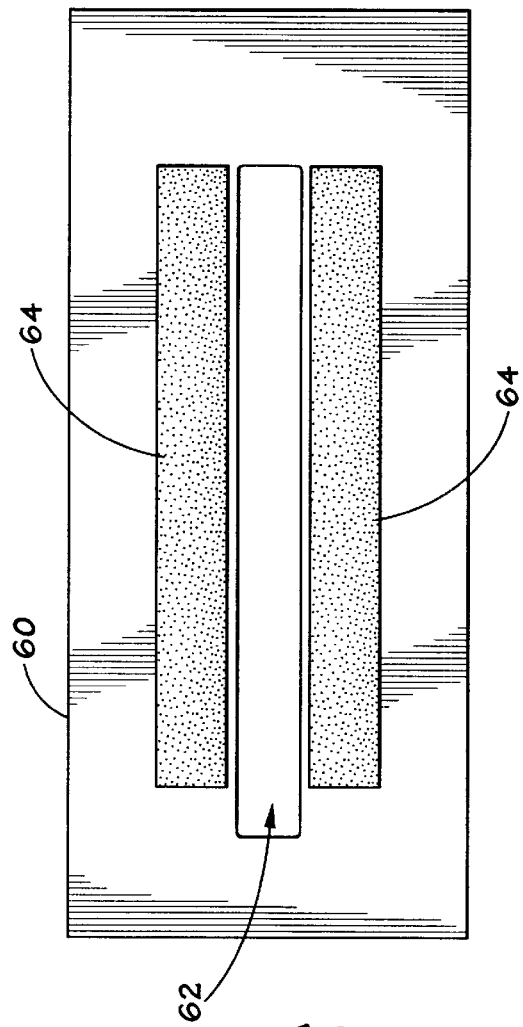
FIG. 4A illustrates a plan view of the substrate of a FBGA device.
Figure 4B:
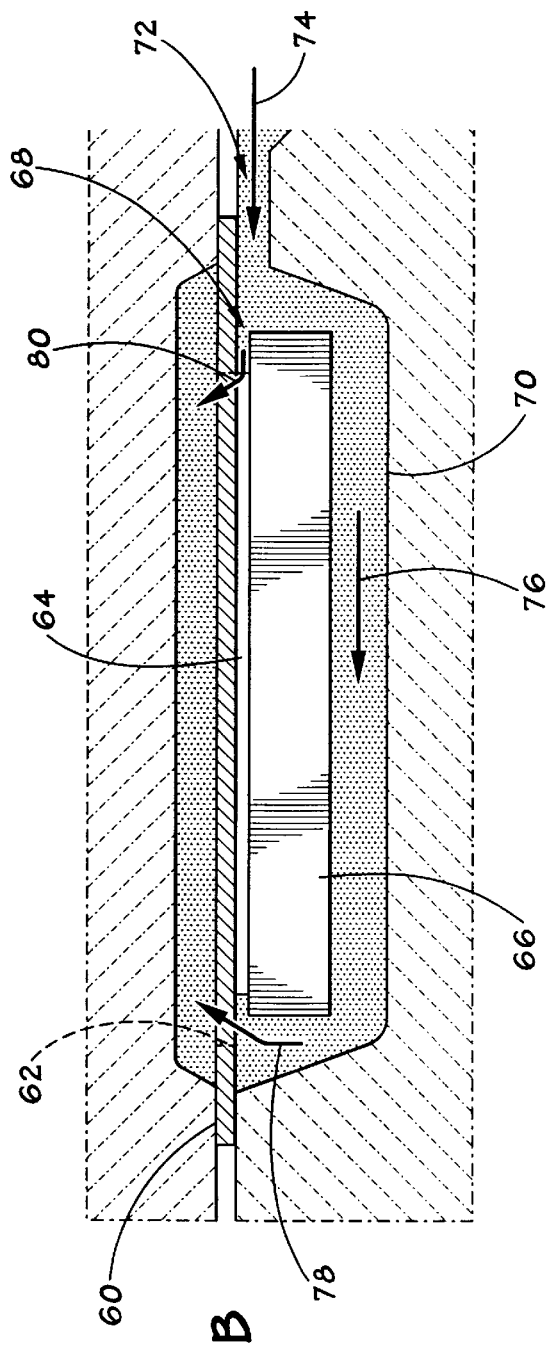
FIG. 4B illustrates an elevational view of a FBGA device during the molding process.

Referring to FIG. 4A a substrate 60 used to form an FBGA device is shown. It is noted that the following discussion is likewise applicable to PGA and BGA devices. The substrate 60 contains an opening or a channel 62 through the center portion of the substrate 60. The shape of the channel 62 is shown as being rectangular, however, the channel 62 not limited to this form. The channel is an aperture which provides a route for wirebonds (not shown) to pass through the substrate 60 from one side to the other. Adhesive 64 is placed on the surface of the substrate 60 adjacent opposing sides of the channel 62. While the adhesive 64 is shown to be tape in the particular embodiment, the adhesive may be provided in alternative forms, such as an epoxy resin for instance. As seen in FIG. 4B, the substrate 60 is adhered to a chip or die 66 by the adhesive tape 64. A gap 68 is formed between the substrate 60 and the die 66 having the same dimension as the thickness of the disposed adhesive tape 64.

To perform the encapsulating process, the substrate 60 and die 66 are placed in a molding cavity 70 with the die 66 on the bottom side. Molding compound is introduced into the molding cavity 70 of a mold gate 72 located at an edge of the substrate 60. The molding compound then flows as indicated by directional arrows 74, 76, 78, and 80. The molding compound first flows in through the mold gate 72 in the direction indicated by arrow 74. The molding compound then takes one of two alternative paths. The first path is downward around the die as indicated by arrow 76, and then up through an exposed section of the channel 62 to fill the channel as generally indicated by directional arrow 78. The second path the molding compound might take is directly into gap 68 adjacent the mold gate 72 and into the channel 62 as indicated by directional arrow 80. Thus, in this configuration, the flow path of the molding compound is not controlled, because the molding compound is free to take either of the two independent paths. The lack of flow path control may lead to a variety of undesired results including incomplete mold fill, mold bleed, discontinuities in the final mold, and/or electrical bridging.

Referring now to FIGS. 5A and 5B, an alternate advantageous embodiment is shown. Again, the substrate 60 is shown having an aperture, in the form of a channel 62, through the center portion of the substrate. As discussed previously, the channel 62 is provided as a route to allow wirebonds (not shown) to pass through the substrate 60 from one side to another. Adhesive 64 is placed adjacent the channel 62 on opposing sides. Again, the adhesive may take various forms, but is shown as adhesive tape in the particular embodiment. The substrate 60 is adhered to a die 66 by means of the adhesive tape 64. A gap 68 is formed between the substrate 60 and the die 66 having the same dimension as the thickness of the disposed adhesive tape 64. A barrier 82 having a thickness similar to that of the adhesive tape 64 is disposed between the substrate 60 and the die 66 adjacent one end of the channel 62 and advantageously abutting the adhesive tape 64. The barrier 82 is placed on the end of the substrate 60 adjacent the mold gate 72.

Having placed the barrier 82 at the end of the channel 62 adjacent the mold gate, one flow path has been effectively eliminated (i.e., the path indicated by directional arrow 80 in FIG. 4B). There is now only one flow path for the mold compound to follow as indicated by directional arrows 74, 76, and 78. In this path the molding compound is first introduced at the mold gate 72 and flows in the direction indicated by arrow 74. The molding compound then flows through the bottom of the mold cavity 70 and surrounds the die 66 as generally indicated by directional arrow 76. Finally, the molding compound flows through an exposed section of the channel 62 at the end opposite the barrier 68 as indicated by directional arrow 78. The molding compound then fills the channel 62 for completion of the mold.

In the illustrated embodiment, the barrier 82, as shown in FIGS. 5A and 5B, is formed of a piece of adhesive tape similar to the other adhesive members 64 already disposed between the substrate 60 and the die 66. It is contemplated that the barrier 82 and adhesive members 64 may be formed as one integral and continuous member. It is also contemplated that the barrier 82 may be formed of alternative adhesive materials such as an epoxy resin.

Alternatively, the barrier 82 may be a non-adhesive member. For instance, the barrier 82 could be a non-adhesive compressible or non-compressible member which conforms to the thickness of the gap 68. Use of a conforming compressible member would have the advantage of being adaptable to different processes and package components, including adhesive, without changing the size or type of barrier material. The barrier could also be formed integral to the substrate by building or forming a wall when the substrate is formed.

By utilizing the barrier 82 to control the flow path of the molding compound, more control is exhibited in formation of the resultant mold. The more precise control that can be exhibited, the fewer defects will result and thus a higher yield of usable devices. In particular, fewer voids in the mold will result, material characteristics will be more homogenous, mold flashing onto the substrate will be less likely to occur, there will be fewer instances of incomplete channel fill, stress will be reduced in the resultant mold, and electrical pathways will have greater integrity.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of forming a molded semiconductor package comprising the acts of:

(a) providing a substrate having a first surface, a second surface and an elongated aperture therethrough, the aperture being defined by a first and a second end and a first and a second side;

(b) disposing a fluid barrier between the die and the substrate adjacent the first and second side and the second end of the elongated aperture;

(c) adhering a die to the second surface of the substrate, the die having an outer perimeter;

(d) locating the die in relation to the substrate such that the first end of the aperture is exposed near the outer perimeter of the die allowing fluid communication through the aperture from the first side of the substrate to the second side of the substrate via the exposed portion of the aperture;

(e) providing a mold, the mold having an inlet gate at an edge of the mold for introduction of a mold compound;

(f) suspending the substrate within the mold wherein the substrate is placed such that the first end of the aperture is farthest from the inlet gate of the mold; and (g) flowing the mold compound into the mold such that it first flows around the die and then flows through the exposed portion of the aperture from the second surface of the substrate to the first surface of the substrate to form an encapsulated package.

2. The method of claim 1, wherein the acts are performed in the order recited.

3. The method of claim 1, wherein act (b) comprises the acts of forming the barrier integral to the substrate.

4. The method of claim 1 comprising the acts of electrically coupling a plurality of wire bonds to the first surface of the die, extending the wire bonds through the aperture and way from the substrate at a time prior to flowing the mold compound into the mold.

5. The method of claim 1 comprising the acts of electrically coupling a plurality of conductive members to the plurality of wire bonds at a surface of the encapsulated package.

6. The method of claim 1 wherein act (b) comprises the act of coupling an adhesive between the die and the substrate to form the fluid barrier.

7. The method of claim 6 wherein act (b) comprises the act of forming the barrier of a continuous tape member disposed adjacent the first and second sides and the second end of the elongated aperture.

8. The method of claim 6 wherein act (b) comprises the act of forming the barrier of a plurality of tape members disposed adjacent the first and second sides and the second end of the elongated aperture.

9. The method of claim 6 wherein the adhesive comprises an epoxy resin.

* * * * *